United States Patent [19]
Crotti

[11] Patent Number: 4,957,881
[45] Date of Patent: Sep. 18, 1990

[54] FORMATION OF SELF-ALIGNED CONTACTS

[75] Inventor: Pier L. Crotti, Landriano, Italy

[73] Assignee: SGS-Thomson Microelectronics s.r.l., Italy

[21] Appl. No.: 424,450

[22] Filed: Oct. 20, 1989

[30] Foreign Application Priority Data

Oct. 20, 1988 [IT] Italy ............................... 83673 A/88

[51] Int. Cl.⁵ .......................................... H01L 23/522
[52] U.S. Cl. ...................................... 437/195; 437/40; 437/41; 437/51; 437/228; 437/235; 437/245
[58] Field of Search ..................... 437/40, 41, 51, 195, 437/228, 245, 235; 357/40

[56] References Cited

U.S. PATENT DOCUMENTS

| 4,398,335 | 8/1983 | Lehrer | 437/195 |
| 4,502,210 | 3/1985 | Okuyama et al. | 437/195 |
| 4,505,030 | 3/1985 | Jeuch | 437/228 |
| 4,545,852 | 10/1985 | Barton | 437/228 |
| 4,662,064 | 5/1987 | Hsu et al. | 437/228 |
| 4,894,351 | 1/1990 | Balty | 437/228 |

FOREIGN PATENT DOCUMENTS

| 0142544 | 7/1985 | Japan | 437/195 |
| 0173856 | 9/1985 | Japan | 437/195 |
| 0078855 | 4/1987 | Japan | 437/245 |

Primary Examiner—Brian E. Hearn
Assistant Examiner—T. Thomas
Attorney, Agent, or Firm—Pollock, Vande Sande & Priddy

[57] ABSTRACT

A process for forming self-aligned metal-semiconductor contacts in a device comprising MISFET type structures essentially comprises conformably depositing a matrix metallic layer on the front of the wafer and the subsequent deposition of a planarization SOG layer. After having used a noncritical mask for defining the "length" of the selfaligned contacts to be formed, the SOG layer is etched until leaving a residue layer on the bottom of the valleys of the conformably deposited matrix metallic layer in areas between two adjacent gate lines of polysilicon. A selective etching of the matrix layer using said SOG residues as a mask, defines the contacts, self-aligned in respect to the opposite spacers of two adjacent polysilicon gate lines. An insulating dielectric layer is deposited and etched until exposing the peaks of the preformed contacts. Over such an advantageously planarized surface contacts on the polysilicon gate lines may be defined by a customary masking process and finally the second level metal is deposited.

1 Claim, 2 Drawing Sheets

FORMATION OF SELF-ALIGNED CONTACTS

BACKGROUND OF THE INVENTION

1. Field of the invention

The present invention relates to a process for forming self-aligned metal-semiconductor ohmic contacts in integrated circuits and particularly on integrated MISFET structures.

2. Description of the prior art

The problem of electrically connecting the drain (and source) of MISFET structures (or more commonly of MOS transistors) to the respective metal tracks in integrated circuits becomes increasingly critical with the reduction of the sizes of these integrated structures. In FIG. 1 a conventional form of a contact between a metal layer 1 and the silicon 3 in an area comprised between two parallel gate lines, 4 and 5 respectively, commonly made of polycrystalline silicon and provided with lateral tapered spacers 6 of a dielectric material, commonly of silicon oxide, is depicted. The contact is formed through a "hole" which is purposely opened across the thickness of the dielectric layer 2 by means of a masking and etching process.

With decreasing dimensions, the lithographic difficulties relative to the definition of such micrometric windows through the masking resist and to the correct alignment of the mask and the processing difficulties relative to ensuring a good step coverage of the deposited metal within minuscule holes through the thickness of the dielectric layer 2 increase.

Lately several new techniques have been proposed for overcoming these technological problems and for making contacts of sub-micrometric size, necessary for fabricating VLSI and ULSI integrated devices, namely: improved techniques for tapering the holes for more easily achieving a good step coverage by the metal, improved lithographic techniques for enhancing the definition of areas with both dimensions smaller than one micrometer, often associated with special techniques for pre-filling the holes by means of metal plugs.

Generally a definite drawback of the known techniques is represented by the fact that the masking of the contacts remains a highly critical step requiring adequate levels of precision.

OBJECTIVE AND SUMMARY OF THE INVENTION

A main objective of the present invention is to provide a new process for making substantially self-aligned metal-semiconductor contacts of MISFET type structures.

Basically the present invention provides a process for making metal-semiconductor contacts without requiring the use of a contact mask while obviating also the technological problems of depositing a metal inside sub-micrometric holes. The invention represents an effective solution of lithographic definition problems as well as of step coverage problems in forming sub-micrometric contacts.

Another peculiar feature of the process object of the present invention is represented by the fact that the contacts are made in a perfectly self-aligned manner in respect to adjacent gate structures already formed on the surface of the wafer when proceeding to form the contacts.

BRIEF DESCRIPTION OF THE DRAWINGS

The different aspects and advantages of the invention will be illustrated more fully through the following description of an embodiment thereof and by means of the annexed drawings, wherein.

DESCRIPTION OF A PREFERRED EMBODIMENT OF THE INVENTION

Figure 1:
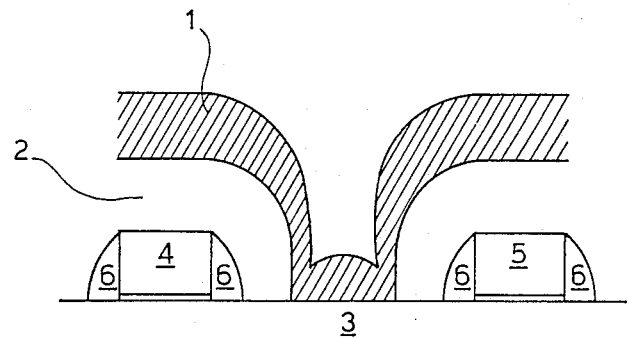
FIG. 1 depicts a contact made in accordance with a known technique, as already described.
Figure 2:
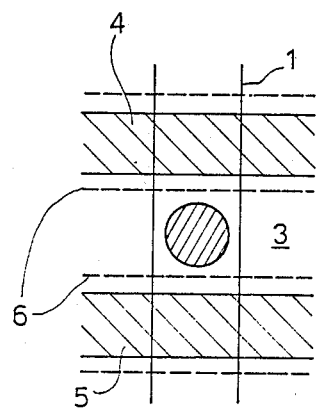
FIG. 2 is a plan view of the contact of the prior art of FIG. 1 photolithographically defined on the silicon area comprised between two adjacent gate lines.
Figure 3:
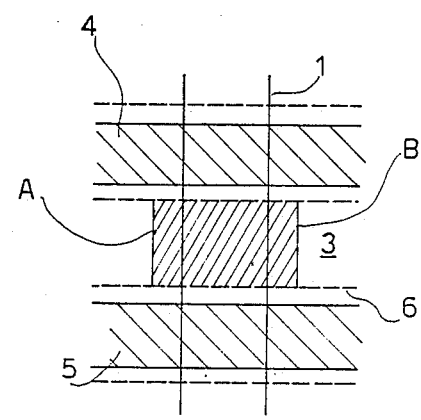
FIG. 3 is a schematic plan view of a self-aligned contact made in accordance with the present invention.

A comparison between the schematic plan views of a contact made according to the prior art (FIG. 2) and made in accordance with the present invention (FIG. 3) makes readily appreciable one of the peculiar aspects of the invention. In the figures the common structural elements are indicated by the same numbers already used in the illustration of FIG. 1. The two adjacent gate lines are indicated with 4 and 5, respectively, and by means of a dash line is also indicated the edge of the respective spacers 6 of dielectric material formed along the sides of the gate lines 4 and 5 of conducting material, commonly of polycrystalline silicon heavily doped for increasing its electrical conductivity. The area of the contact formed through the insulating dielectric layer (indicated with 2 in FIG. 1) for establishing an electrical continuity with a second metal level, a defined track of which is indicated with 1 in the plan views of FIGS. 2 and 3, is evidenced by means of parallel, close-spaced, hatching. As it may be observed, in the case of the contact made in accordance with the prior art, the definition of the contact must be accurately aligned by photolithographic means on the area comprised between the two opposite edges of the spacers 6 of the two adjacent gate lines 4 and 5. By contrast, in the case of a contact made in accordance with the present invention, the formation of the contact takes place in a self-alignment condition in respect to the two adjacent gate lines 4 and 5, as it will be evidenced in the following description of the process of the invention.

Figure 4:
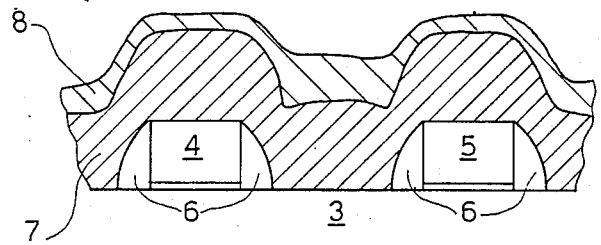
FIGS. 4 to 9 depict the process of the invention for making self-aligned contacts.

The basic steps of the process of the invention are depicted in the FIGS. 4 to 9 and comprise the following:

(a) conformably depositing (i.e. under deposition conditions favoring substantially the formation of a deposit of uniform thickness above an underlying existing morphology, which in the specific instance is characterized by the presence on the front of the wafer being fabricated of parallel gate lines in the form of parallel tracks 4 and 5 of a first conducting material insulated from the silicon 3 by a layer of gate oxide and provided with tapered silicon oxide spacers 6) a matrix metal layer 7 essentially of a different metallic material from the one used for making the gate lines 4 and 5. For instance aluminum may be used for making this matrix metal layer 7 when the gate lines 4 and 5 are customarily made of polycrystalline silicon. The thickness of the matrix metal layer 7 conformably deposited for instance by sputtering, must be sufficient for the bottom of the valleys which are formed between two adjacent gate lines to be at a level higher than the peak level of the gate lines 4 and 5, as depicted in FIG. 4. The thickness of this matrix metal layer 7 may in practice be of about 10.000 Angstroms.

(b) Depositing a layer 8 of a planarization material, e.g. spun-on-glass or SOG, having a thickness of about 2.000 Angstroms "on peaks" and of about 6.500. "Angstroms in valleys". Characteristics and procedures-for applying such a planarization material (SOG) are well known to the skilled technician and any further description appears superfluous. A suitable commercially available material of this kind is produced by Allied Chemicals under the trade denomination AC410. A cross-section of the wafer at this point of fabrication is depicted in FIG. 4.

Figure 5:
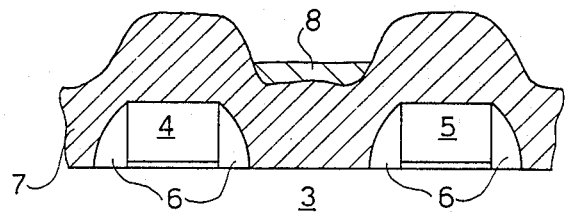

(c) Plasma etching the SOG layer 8 for removing it from the peaks as well as from the areas of the wafer where the formation of contacts with the monocrystalline silicon substrate 3 isn't contemplated by employing for this reason a standard type mask which obviously has not any critical aspect. This etching is conducted so as to preserve a residual layer of planarization material 8 on the bottom of the valleys between adjacent gate lines in the areas of the wafer where contacts must be formed, as depicted in FIG. 5. In other words, by means of a noncritical masking step, the "length" of the contacts is defined, i.e. the two edges indicated by the letter A and B in the plan view of FIG. 3, while in the orthogonal direction (the "width") the contact is self-aligned between the gate lines. The residual layer 8 on the bottom of the valleys (FIG. 5) may have in practice a residual thickness of about 4.500 Angstroms.

Figure 6:
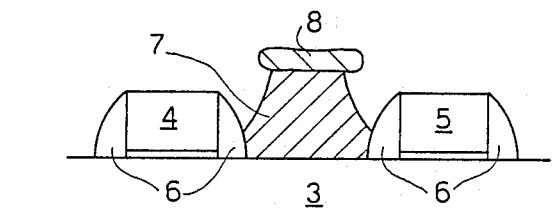

(d) Selectively etching the metallic material of the matrix layer 7 by means of a RIE (Reactive Ion Etching) or plasma etching process under conditions such as to produce a selective etching of the metallic material 7 in respect to both said residual SOG material 8 and the dielectric material (SiO$_2$) constituting the spacers 6, as well as in respect to the metallic material (polycrystalline silicon) of the gate lines 4 and 5 in case the latter are not provided with a protecting insulating coating. When using aluminum as the metallic material for the matrix layer 7, a plasma containing chlorinated compounds is preferably used. In other words the etching of the matrix metallic layer 7 is performed by using as a mask the residues of the planarization SOG 8 defined along the bottom of valleys of the previously deposited matrix metallic layer 7, over the contact areas with the underlying silicon substrate 3. This etching is conducted for a time sufficient to lower the etching edge of the matrix layer 7 down to an intermediate level down the flank of the spacers 6, as depicted in FIG. 6.

Figure 7:
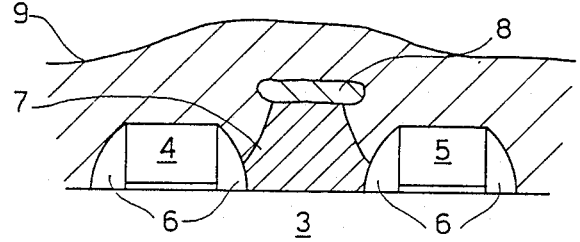

(e) Depositing an insulating layer of dielectric material 9, e.g. silicon oxide deposited by low pressure chemical vapor deposition, in order to completely insulate the metallic material 7 defined in a substantially self-alignment manner between adjacent gate lines, without substantially employing a real contact mask. Of course the insulating layer 9 may also be a multilayer made by depositing in succession layers of different dielectric materials by means of respectively different deposition procedures. A cross-section of the wafer at this point of fabrication is depicted in FIG. 7.

Figure 8:
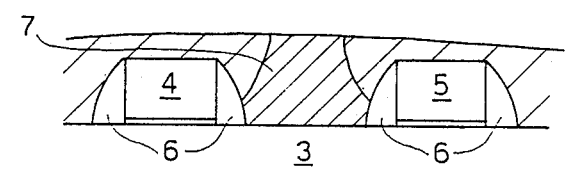
Figure 9:
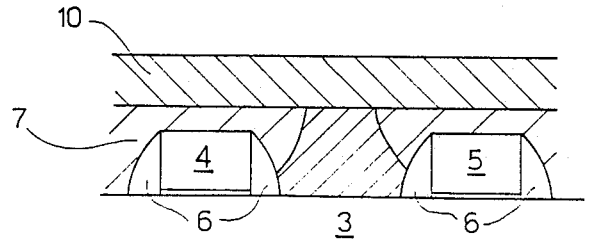

(f) Etching the dielectric material of the insulating layer 9 and the masking residues of SOG 8 by plasma etching until exposing the peaks of the defined contacts metal structures 7. A cross-section of the wafer at this point of fabrication is depicted in FIG. 8.

(g) Depositing a new layer of metallic material 10 in electrical continuity with the "risers" 7 of the contacts, followed by masking for defining the conducting tracks of this second level metal 10 (e.g. the tracks 1 of FIG. 3). A cross-section of the contact made in accordance with the process of the invention is substantially the one depicted in FIG. 9.

Contacts with the gate polycrystalline silicon lines may be formed by customary masking methods, being the definition of these contacts on polycrystalline silicon much less critical in respect to the degree of definition required for contacts on the silicon substrate. The process of the invention will normally require the use of an additional mask in respect to the total number of masks normally used in accordance with fabrication processes of the prior art, however such an additional mask (used during the step (d) of the above described process), is noncritical, as already explained.

As it is easily observed by comparing FIGS. 2 and 3, the process of the invention produces contacts with an extended area, because of the self-alignment of the contacts with the adjacent gate structures, with attendant advantages in terms of reduction of contact resistance and, by eliminating alignment inaccurracies to be accounted for with the processes of the prior art, it is possible to reduce the cell size at least in a direction orthogonal to the gate lines.

Moreover, intrinsic to the novel process of the invention is the possibility of greatly improving the degree of planarization of the device by choosing appropriate techniques and methods for depositing and etching the insulating dielectric layer 9 during the steps (e) and (f) of the process for forming the self-aligned contacts. This advantageous aspect will favorably influence the definition of contacts on the gate polycrystalline silicon and the formation of the conductive lines of the second level metal 10, as it will be evident to any skilled technician.

I claim:

1. A process for forming self-aligned metal-semiconductor contacts in MISFET type integrated structures which determine, during fabrication, a superficial morphology characterized by the presence of substantially parallel gate lines of a first conducting metallic material provided on the sides thereof with tapered lateral spacers of a dielectric material over the surface of a wafer of a monocrystalline semiconductor material, comprising:

(a) conformably depositing over said surface of the wafer a matrix layer of a second metallic material with a thickness sufficient for the bottom of valleys of said conformably deposited metal layer between two adjacent gate lines to be at a level higher than the level of peaks of said gate lines;

(b) depositing a layer of a planarization material over said conformably deposited matrix metallic layer;

(c) masking and etching said planarization material until exposing the peaks of said conformably deposited matrix metallic layer and leaving a residual layer of planarization material on the bottom of said valleys for a length defined by the mask;

(d) selectively etching said second metallic material using said residual layer of planarization material on the bottom of said valleys as a mask until lowering the etch edge of said second metallic material layer conformably deposited to an intermediate level down the flank of said tapered lateral spacers of dielectric material on the sides of said gate lines of said first metallic material;

(e) depositing a layer of dielectric material for insulating the residue of said second metallic material under each masking residue of said planarization material;

(f) etching said insulating layer of dielectric material and said masking residue of planarization material until exposing the peaks of said residues of said second metallic material; and (g) depositing a third layer of metallic material in electrical continuity with said residue of said second metallic material through the exposed peaks thereof.

* * * * *